United States Patent
Nukanobu et al.

(10) Patent No.: US 8,129,096 B2
(45) Date of Patent: Mar. 6, 2012

(54) METHOD FOR MANUFACTURING CONDUCTIVE MEMBER PATTERN

(75) Inventors: Koki Nukanobu, Machida (JP); Naofumi Aoki, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 375 days.

(21) Appl. No.: 12/427,946

(22) Filed: Apr. 22, 2009

(65) Prior Publication Data

US 2009/0286184 A1 Nov. 19, 2009

(30) Foreign Application Priority Data

May 14, 2008 (JP) .................... 2008-126630

(51) Int. Cl.
*G03F 7/26* (2006.01)
(52) U.S. Cl. ..................... 430/315; 430/330
(58) Field of Classification Search ............ 430/315, 430/330
See application file for complete search history.

(56) References Cited

U.S. PATENT DOCUMENTS

| | | | |
|---|---|---|---|
| 2003/0026959 A1 | 2/2003 | Furuse et al. | 428/195 |
| 2006/0045960 A1* | 3/2006 | Furuse et al. | 427/66 |
| 2007/0009839 A1* | 1/2007 | Harumoto | 430/313 |

* cited by examiner

*Primary Examiner* — Kathleen Duda
*Assistant Examiner* — Caleen Sullivan
(74) *Attorney, Agent, or Firm* — Fitzpatrick, Cella, Harper & Scinto

(57) ABSTRACT

A method capable of easily and simply manufacturing a conductive member pattern such as a nano-size fine wiring or electrode is disclosed. Specifically, the disclosed method for manufacturing a conductive member pattern includes the steps of: forming an ion-exchangeable resin pattern on a substrate by using a photosensitive resin; making the resin pattern absorb a metal component-containing solution; and baking the resin pattern having absorbed the metal component-containing solution, wherein the width and the ratio "width/height" of the resin pattern before baking are 1 μm or less and 5 or less, respectively.

2 Claims, 1 Drawing Sheet

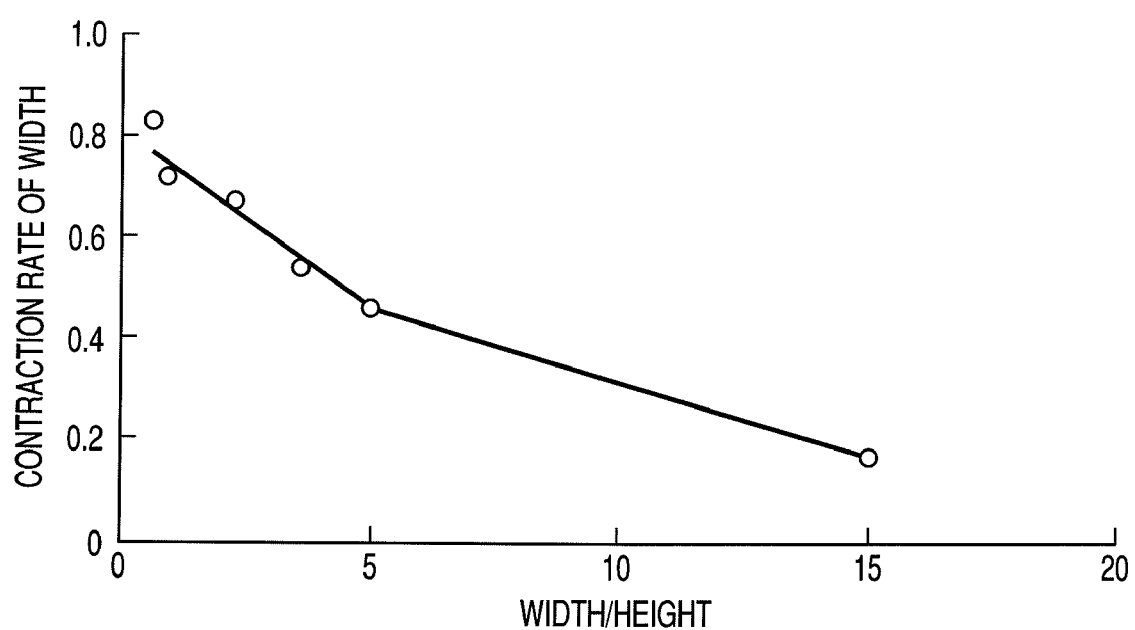

METHOD FOR MANUFACTURING CONDUCTIVE MEMBER PATTERN

BACKGROUND OF THE INVENTION

1. Field of the Invention

The present invention relates to a method for manufacturing a conductive member pattern formed of a metal or a metal compound, to be used for an electrode or a wiring.

2. Description of the Related Art

The following and other methods have hitherto been known as the method for forming a conductive pattern of a metal or a metal compound to serve as an electrode or a wiring.

(1) A method in which a conductive paste is printed in an intended pattern by using screen printing, dried and baked to form a pattern.

(2) A method based on transfer printing.

(3) A method in which a conductive paste is applied to a whole surface, dried and baked to form a metal film, a necessary portion of the metal film is covered with a mask such as a photoresist and the other portion of the metal film is subjected to an etching treatment to form a necessary pattern.

(4) A method in which a metal paste is imparted with photosensitivity, and a necessary portion is exposed and thereafter developed to form a pattern.

In addition to the above-described methods, Japanese Patent Application Laid-Open No. 2003-031922 discloses a method in which a resin pattern is formed on a substrate by using a photosensitive resin, the resin pattern is made to absorb a metal component-containing solution, and thereafter the resin pattern is baked to form a conductive thin film pattern on the substrate.

However, the method (1) is hardly applicable to fine electrode patterns, and the method (2) is insufficient in the uniformity and reproducibility of the film thickness. The method (3) requires to use a strong acid at the time of etching, in particular, in the case where electrode patterns are formed with noble metals such as platinum; and hence from the reason that the resist is eroded and an insulating substrate is corroded and from other reasons, the method (3) is hardly applicable to fine circuit formation. Additionally, the method (4) offers a problem such that particularly when the conductive pattern is formed of a noble metal such as platinum, a large amount of the noble metal component is removed at the time of etching or development, and hence the labor and time and the equipment burden for the recovery and recycle of the removed noble metal component are significant.

SUMMARY OF THE INVENTION

The present invention takes as its object the provision of a method capable of easily and simply manufacturing a conductive member pattern such as a nano-size fine wiring or electrode.

The present invention discloses a method for manufacturing a conductive member pattern including the steps of: forming an ion-exchangeable resin pattern on a substrate by using a photosensitive resin; making the resin pattern absorb a metal component-containing solution; and baking the resin pattern having absorbed the metal component-containing solution, wherein the width and the ratio "width/height" of the resin pattern before the baking step are 1 µm or less and 5 or less, respectively.

Further features of the present invention will become apparent from the following description of exemplary embodiments with reference to the attached drawing.

BRIEF DESCRIPTION OF THE DRAWING

FIGURE is a graph showing the relation between the ratio "width/height" of the resin pattern and the "contraction rate of the width" associated with the baking in Example 1 of the present invention.

DESCRIPTION OF THE EMBODIMENTS

The present invention discloses a method for manufacturing a conductive member pattern including the steps of: forming an ion-exchangeable resin pattern on a substrate by using a photosensitive resin; making the resin pattern absorb a metal component-containing solution; and baking the resin pattern having absorbed the metal component-containing solution, wherein the width and the ratio "width/height" of the resin pattern before the baking step are 1 µm or less and 5 or less, respectively.

In the present invention, preferably the ion-exchangeable resin includes at least one of a carboxylic acid group and a sulfonic acid group.

In the present invention, the ratio "width/height" of the resin pattern before baking set at 5 or less enables to manufacture with a satisfactory accuracy a thin nano-size wire of 1 µm or less after baking.

The present invention includes a step of forming a resin pattern, an absorption step and a baking step. For the step of forming a resin pattern, a photolithography technique or a nanoimprint technique is used.

First, the step of forming a resin pattern on the basis of the photolithography technique is described. The concerned step includes the steps of: applying, drying, exposing and developing a photosensitive resin.

The applying step is a step of applying the photosensitive resin to an insulating substrate on which a conductive member pattern is to be formed. This application can be conducted by using various printing methods (such as screen printing, offset printing and flexographic printing), and other methods such as a spinner method, a dipping method, a spray method, a stamp method, a rolling method, a slit coater method and an ink-jet method.

As the photosensitive resin used in the present invention, used is a solution of a resin which forms a resin pattern being capable of absorbing a below-described metal component-containing solution and additionally reacting with the metal component in the solution and being ion-exchangeable, or used is a precursor of such a resin. The formation of the ion-exchangeable resin pattern enables the below-described absorption step to be an ion-exchange absorption step, and consequently, enables the metal-component absorption to be improved, the use efficiency of the material to be increased and a well-shaped pattern to be formed. As an ion-exchangeable resin, because of being particularly preferable from the viewpoint of controlling the pattern shape, preferable is an ion-exchangeable resin having at least one of a carboxylic acid group and a sulfonic acid group. The photosensitive resin may be either a type (negative type) which is made insoluble in a developer by light irradiation or a type (positive type) which is made soluble in a developer by light irradiation. Additionally, the photosensitive resin may be either a type having a photosensitive group in the resin structure thereof or a type having a photosensitizing agent as mixed therein. In any of these types of photosensitive resins, a photoreaction initiator or a photoreaction inhibitor may be appropriately mixed.

The photosensitive resin may be either water-soluble or solvent-soluble; however, a water-soluble photosensitive resin is preferable from the reasons such that a satisfactory working environment is easily maintained and the load exerted on the nature by the waste is small. A water-soluble photosensitive resin means a photosensitive resin the development of which in the below-described development step can be conducted with water or a developer that contains water in an amount of 50% by mass or more. Additionally, a solvent-soluble photosensitive resin means a photosensitive resin the development of which in the development step can be conducted with an organic solvent or a developer that contains an organic solvent in an amount of 50% by mass or more.

Further, the water-soluble photosensitive resin is described. As the water-soluble photosensitive resin, usable is a photosensitive resin which is compatible with the use of a developer that contains water in an amount of 50% by mass or more and contains, for example, a lower alcohol as added thereto within a range of less than 50% by mass for the purpose of increasing the drying speed, or a developer to which added is a component to promote the dissolution, to improve the stability or to attain the like of the photosensitive resin component. Examples of the lower alcohol include methyl alcohol and ethyl alcohol. From the viewpoint of alleviating the environmental load, preferable is a water-soluble photosensitive resin developable with a developer having a water content of 70% by mass or more, more preferable is a water-soluble photosensitive resin developable with a developer having a water content of 90% by mass or more, and most preferable is a water-soluble photosensitive resin developable only with water as a developer. Examples of such a water-soluble photosensitive resin may include the resins in which water soluble resins such as polyvinyl alcohol resins or polyvinyl pyrrolidone resins are used.

The drying step is a step of drying the coated film by evaporating the solvent in the coated film formed of the photosensitive resin applied onto the substrate in the applying step. The drying of the coated film can be conducted at room temperature, but is conducted preferably under heating for the purpose of reducing the drying time. The heat drying is conducted by using, for example, a windless oven, a dryer or a hot plate; in general, drying is conducted by allowing the coated film to stand at a temperature between 50° C. to 100° C. for 1 minute to 30 minutes.

The exposure step is a step of exposing the coated film on the substrate, having been dried in the drying step, according to a predetermined pattern. The range in which exposure is applied with light irradiation in the exposure step is varied depending on whether the photosensitive resin used is a negative type or a positive type. In the case of the negative type, which is made insoluble in a developer by light irradiation, the intended pattern area is exposed by light irradiation applied thereto; however, in the case of the positive type, which is made soluble in a developer by light irradiation, the area outside the intended pattern area is exposed by light irradiation applied thereto, in contrast to the negative type case. The choice between the light-irradiation area and the non-light-irradiation area can be made in the same manner as in the technique for the usual mask formation with a photoresist.

The development step is a step of removing the coated film in the area outside the intended pattern area in the coated film having been exposed in the exposure step. When the photosensitive resin is a negative type, the coated film portion free from light irradiation is soluble in the developer and the coated film portion exposed, namely, irradiated with light is made insoluble in the developer, and hence development can be conducted by removing by dissolving with the developer the coated film portion free from light irradiation so as not to be made insoluble in the developer. Additionally, when the photosensitive resin is a positive type, the coated film portion free from light irradiation is insoluble in the developer and the coated film portion exposed, namely, irradiated with light is made soluble in the developer, and hence development can be conducted by removing by dissolving with the developer the coated film portion irradiated with light to be made soluble in the developer. As the developer, the same developers as used for usual photoresists can be used.

As described above, the step of forming the resin pattern is also feasible by using the nanoimprint technique. Specifically, the intended pattern can be formed by pressing a mold having a nanoscale concave and convex pattern formed thereon against the substrate coated with the resin thin film to transfer print the concave and convex pattern to the resin thin film.

The resin pattern formed in the step of forming the resin pattern, namely, the resin pattern before the baking step is prepared in such a way that the width and the ratio "width/height" thereof are 1 μm or less and 5 or less, respectively.

The absorption step is a step of making the resin pattern, formed by passing through the above-described step, absorb the metal component-containing solution. The absorption step in the present invention is an ion-exchange absorption step because the resin pattern has ion-exchangeability. The absorption method may adopt any technique such as a dipping method or a spin coating method as long as the technique concerned is capable of making the pattern absorb the metal component-containing solution.

The metal component-containing solution used in the present invention may be an organic solvent solution using an organic solvent-based solvent containing an organic solvent in an amount of 50% by mass or more, or an aqueous solution using an aqueous solvent containing water in an amount of 50% by mass or more as long as the solution concerned is capable of forming a metal film or a metal compound film by baking. Usable as the metal component-containing solution is, for example, a solution in which an organometallic compound of platinum, silver, palladium or copper, soluble in an organic solvent or soluble in water is dissolved as the metal component in an organic solvent-based solvent or an aqueous solvent.

As the metal component-containing solution used in the present invention, an aqueous solution is preferable from the reasons such that a satisfactory working environment is easily maintained and the load exerted on the nature by the waste is small. The aqueous solvent for the aqueous solution may be a solvent that contains water in an amount of 50% by mass or more and contains, for example, a lower alcohol as added thereto within a range of less than 50% by mass for the purpose of increasing the drying speed, or an aqueous solvent to which added is a component to promote the dissolution, to improve the stability or to attain the like of the above-described organometallic compound. Examples of the lower alcohol include methyl alcohol and ethyl alcohol. From the viewpoint of alleviating the environmental load, the content of water is preferably 70% by mass or more and more preferably 90% by mass or more, and most preferably water accounts for the whole of the aqueous solvent.

In particular, examples of the water-soluble organometallic compound capable of forming a conductive member pattern by baking may include complex compounds of gold, platinum, silver, palladium and copper.

Preferable as such a complex compound is a nitrogen-containing compound in which the ligand or ligands thereof have at least one or more hydroxyl groups. In particular, preferable are the complex compounds in each of which the ligand or ligands are formed of, for example, any one of the nitrogen-containing compounds having 8 or less carbon compounds, such as alcoholamiens such as ethanolamine, propanolamine, isopropanolamine and butanolamine; serinol and TRIS; or alternatively a plurality of types of these compounds.

The reasons for the preferable use of the above-described complex compounds include the fact that these compounds are high in water solubility and low in crystallinity. For example, some commonly marketed ammine complexes and the like cause crystal deposition during drying to disturb formation of uniform films as the case may be. On the other hand, adoption of "flexible" ligands such as aliphatic alkyl amines enables to lower the crystallinity, but the hydrophobicity of the alkyl group may degrade the water solubility. In contrast to these possibilities, the adoption of the above-described ligands enables to make compatible the highness of the water solubility and the lowness of the crystallinity with each other.

Additionally, for the purpose of improving the film quality of the obtained conductive member pattern and improving the adhesion of the obtained conductive member pattern to the substrate, it is preferable that an elemental substance or a compound of, for example, rhodium, bismuth, ruthenium, vanadium, chromium, tin, lead or silicon be contained as the component of the above-described metal compound.

The baking step is a step of baking the coated film remaining on the substrate after passing through the above-described steps, decomposing and removing the organic components in the coated film, and forming the film of the metal contained as the metal compound component. The baking may be conducted in the air; however, in the case of the easily-oxidizable metal film of copper, palladium or the like, the baking may be conducted under vacuum or in a deoxidized atmosphere (for example, in an atmosphere of an inert gas such as nitrogen). The baking is varied depending on the type of the organic component contained in the coated film; usually, the baking can be conducted by allowing the coated film to stand at a temperature of 400° C. to 600° C. for a few minutes to a few tens minutes. The baking can be conducted with, for example, a hot air circulation furnace or the like. The baking enables to form a conductive member pattern on the substrate, having a pattern width of 0.54 or less times the width (the contraction rate of 0.46 or more) of the resin film pattern before the baking.

EXAMPLES

Example 1

In present Example, an example of a metal pattern formed by using a nanoimprint technique is presented.

A solution prepared by adding to a photosensitive resin ("PAK-01", manufactured by Toyo Gosei Kogyo Co., Ltd.) 50% by mass of β-carboxyethyl acrylate (β-CEA) was applied to the whole surface of a glass substrate (75 mm in length×75 mm in width×2.8 mm in thickness) by using a dispenser.

Then, a mold on which formed was a predetermined linear concave and convex pattern having a recess depth of 200 nm and a recess width of 120 nm to 3 μm was pressed against the coated substrate, the coated substrate was irradiated with the illuminating light from a high-pressure mercury lamp to cure the photosensitive resin. After the completion of the curing, the mold was pulled up to yield an intended resin pattern.

The substrate with the resin pattern formed thereon was immersed in purified water for 30 seconds, and then immersed for 60 seconds in a Pd-complex aqueous solution (palladium acetate-monoethanolamine complex; palladium content: 0.15% by mass). Thereafter, the substrate was taken out, washed with running water for 5 seconds to wash out the Pd-complex aqueous solution remaining between the constituent elements of the resin pattern, subjected to water draining-off with air and dried on a hot plate set at 80° C. for 3 minutes. Then, the resin pattern was baked at 500° C. for 30 minutes with a hot air circulation furnace to yield a metal pattern.

The width (L1) of the resin pattern and the width (L2) of the metal pattern obtained after baking the resin pattern were respectively measured, and a contraction rate [(L1−L2)/L1] was derived. The contraction rate was calculated on the basis of the following formula. The results thus obtained are shown in Table 1.

TABLE 1

| Width before baking L1 (nm) | Width/height before baking | Width after baking L2 (nm) | Contraction rate of width (L1 − L2)/L1 |
|---|---|---|---|
| 120 | 0.6 | 20 | 0.83 |
| 180 | 0.9 | 50 | 0.72 |
| 450 | 2.25 | 150 | 0.67 |
| 720 | 3.6 | 330 | 0.54 |
| 1000 | 5 | 540 | 0.46 |
| 3000 | 15 | 2500 | 0.17 |

FIGURE shows the relation between the ratio "width/height" of the resin pattern before baking and the "contraction rate of the width" associated with baking of the resin pattern. As was found from FIGURE, when the ratio "width/height" took a value of 5 or less, there were obtained contraction rates larger than the values anticipated from the conventional contraction rates (corresponding to the cases of the ratio "width/height" of 5 or more).

Example 2

In present Example, an example of a metal pattern formed by using a photolithography technique is presented.

In the same manner as in Example 1, a photosensitive resin was applied to a glass substrate; the coated substrate was exposed with a high-pressure mercury lamp by using a photomask having a linear pattern of 1 μm or less in width, and treated with a developer by dipping therein for 30 seconds to yield an intended linear resin pattern of 1 μm or less in width.

In the same manner as in Example 1, the obtained resin pattern was immersed in water and then in the Pd-complex aqueous solution for 60 seconds, washed with running water for 5 seconds, then subjected to water draining-off with air, and dried on a hot plate set at 80° C. for 3 minutes. Then, the resin pattern was baked at 500° C. for 30 minutes with a hot air circulation furnace to yield a metal pattern.

The width (L1) of the resin pattern and the width (L2) of the metal pattern obtained after baking the resin pattern were respectively measured and a contraction rate was derived. Thus, also in present Example, it was found that the relation between the ratio "width/height" of the pattern before baking and the "contraction rate of the width" associated with baking of the resin pattern was the same as in Example 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-126630, filed May 14, 2008, which is hereby incorporated by reference herein in its entirety.

What is claimed is:

1. A method for manufacturing a conductive member pattern comprising:
    forming an ion-exchangeable resin pattern on a substrate by using a photosensitive resin containing an organic component, the ion-exchangeable resin pattern having a width which is no more than 1 μm and a width/height ratio which is no more than 5 such that a contraction rate r is no less than 0.46;
    making the ion-exchangeable resin pattern absorb a metal component-containing solution; and
    baking the ion-exchangeable resin pattern having absorbed the metal component-containing solution to remove the organic component from the ion-exchangeable pattern so as to obtain a conductive member pattern containing the metal component derived from the metal component-containing solution,
    wherein the contraction rate r is defined by the following formula (1), $$r = \frac{L1 - L2}{L1} \quad (1)$$

where L1 indicates a width of the ion-exchangeable resin pattern before the baking, and L2 indicates a width of the conductive member pattern after the baking.

2. The method for manufacturing a conductive member pattern according to claim 1, wherein the ion-exchangeable resin comprises at least one of a carboxylic acid group and a sulfonic acid group.

* * * * *